(12) United States Patent
Liao et al.

(10) Patent No.: US 12,140,623 B2
(45) Date of Patent: Nov. 12, 2024

(54) TESTING APPARATUS

(71) Applicants: GLOBAL UNICHIP CORPORATION, Hsinchu (TW); TAIWAN SEMICONDUCTOR MANUFACTURING COMPANY, LTD., Hsinchu (TW)

(72) Inventors: Chih-Chieh Liao, Hsinchu (TW); Yu-Min Sun, Hsinchu (TW); Chih-Feng Cheng, Hsinchu (TW)

(73) Assignees: GLOBAL UNICHIP CORPORATION, Hsinchu (TW); TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 126 days.

(21) Appl. No.: 18/180,101

(22) Filed: Mar. 7, 2023

(65) Prior Publication Data
US 2024/0219448 A1 Jul. 4, 2024

(30) Foreign Application Priority Data
Dec. 28, 2022 (TW) .................................. 111150275

(51) Int. Cl.
*G01R 31/26* (2020.01)
*G01R 1/067* (2006.01)
*G01R 1/073* (2006.01)

(52) U.S. Cl.
CPC ..... *G01R 31/2601* (2013.01); *G01R 1/06722* (2013.01); *G01R 1/07314* (2013.01); *G01R 1/07357* (2013.01)

(58) Field of Classification Search
CPC ............ G01R 31/2601; G01R 1/06722; G01R 1/07314; G01R 1/07357
(Continued)

(56) References Cited

U.S. PATENT DOCUMENTS

2016/0377655 A1* 12/2016 Liberini ............. G01R 1/07378
324/756.03
2017/0192035 A1* 7/2017 Li ........................ G01R 1/0416
2019/0302185 A1* 10/2019 Maggioni .......... G01R 1/07392

FOREIGN PATENT DOCUMENTS

| CN | 217114895 U | 8/2022 |
| TW | 201200879 A | 1/2012 |

(Continued)

OTHER PUBLICATIONS

U.S. Appl. No. 17/804,090, filed May 25, 2022.

*Primary Examiner* — Raul J Rios Russo
(74) *Attorney, Agent, or Firm* — CKC & Partners Co., LLC (57) ABSTRACT

A testing apparatus includes a circuit board, a probe station and a probe array. The circuit board includes a plurality of contacts. The probe station includes a platform located on the circuit board and used for carrying a device under test (DUT), and a plurality of probe holes formed on the platform and arranged in an array. The probe array includes a plurality of telescopic probes respectively linearly inserted into the probe holes. One end of each of the telescopic probes is contacted with one of the contacts, and the other end thereof is contacted with one of solder balls of the DUT. Each of the probe holes includes an elongated groove penetrating through the platform. Each of the telescopic probes is provided with a fin protruding outwardly and inserting into the elongated groove.

20 Claims, 7 Drawing Sheets

(58) Field of Classification Search
USPC .................................................. 324/754.03
See application file for complete search history.

(56) References Cited

FOREIGN PATENT DOCUMENTS

| TW | I626451 B | 6/2018 |
|----|-----------|--------|
| TW | I735239 B | 8/2021 |
| TW | I751940 B | 1/2022 |

\* cited by examiner

TESTING APPARATUS

RELATED APPLICATIONS

This application claims priority to Taiwan Application Serial Number 111150275, filed on Dec. 28, 2022, which is herein incorporated by reference in its entirety.

BACKGROUND

Field of Disclosure

The present disclosure relates to a testing apparatus. More particularly, the present disclosure relates to a testing apparatus for testing a semiconductor element.

Description of Related Art

Generally, a device under test (called DUT hereinafter, e.g., a semiconductor element) will be placed into a test platform during the test stage. Two ends of each telescopic probe installed inside the test platform are in contact with one of the solder balls of the semiconductor element above, and one of the contacts of the circuit board below, respectively.

However, when the semiconductor element presses these telescopic probes down to the contacts of the circuit board, the telescopic probes will respectively wear the contacts of the circuit board in practice, thereby causing scratches and indentations on top surfaces of the contacts, reducing the conductivity of the contacts of the circuit board, which affects the quality of electrical signal transmission and product life.

Therefore, the above-mentioned technology apparently is still with inconvenience and defects and needed to be further develop. Hence, how to develop a solution to improve the foregoing deficiencies and inconvenience is an important issue that relevant persons engaged in the industry are currently unable to delay.

SUMMARY

One aspect of the present disclosure is to provide a testing apparatus for solving the difficulties mentioned above in the prior art.

In one embodiment of the present disclosure, a testing apparatus is provided, and the testing apparatus includes a circuit board, a probe station and a probe array. The circuit board includes a plurality of contacts. The probe station includes a platform located on the circuit board and used for carrying a device under test (DUT), and a plurality of probe holes formed on the platform and arranged in an array. The probe array includes a plurality of telescopic probes respectively linearly inserted into the probe holes, and one end of each of the telescopic probes contacted with one of the contacts, and the other end thereof contacted with one of solder balls of the DUT. Each of the probe holes includes at least one elongated groove penetrating through the platform. Each of the telescopic probes is provided with at least one fin protruding outwardly therefrom and inserting into the elongated groove.

In one embodiment of the present disclosure, a testing apparatus is provided, and the testing apparatus includes a circuit board, a platform, a plurality of probe holes and a plurality of telescopic probes. The circuit board includes a plurality of contacts. The platform is located on the circuit board for carrying a device under test (DUT). The probe holes are spaced arranged on the platform, each of the probe holes is connected to two opposite surfaces of the platform, and recessed with at least one elongated groove on an inner surface thereof. The telescopic probes are respectively linearly inserted into the probe holes, and two opposite ends of each of the telescopic probes are contacted with one of the contacts of the circuit board and one of solder balls of the DUT, respectively. Each of the telescopic probes includes at least one arc-shaped fin extended within the elongated groove and contacting with the elongated groove with a point contact style.

Thus, through the construction of the embodiments above, the disclosure is able to reduce the possibility of scratches and indentations on the contacts of the circuit board by the telescopic probe, thereby avoiding the reduction of the electrical conductivity of the contacts of the circuit board, thereby maintaining the quality of telecommunication transmission and product life.

The above description is merely used for illustrating the problems to be resolved, the technical methods for resolving the problems and their efficacies, etc. The specific details of the present disclosure will be explained in the embodiments below and related drawings.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure.

DESCRIPTION OF THE EMBODIMENTS

Reference will now be made in detail to the present embodiments of the present disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the present disclosure without departing from the scope or spirit of the present disclosure.

Reasons for the prior art mentioned above which have researched and analyzed are discussed below. Since each of the telescopic probes contacts with one of the solder balls of the semiconductor element through a crown head at the end thereof, when the DUT is pressed down to move these telescopic probes to the contacts of the circuit board, pin points of the crown head cannot contact with the corresponding solder ball simultaneously but contact with the corresponding solder ball one after another in practice, so as to exert a rotational torque to the corresponding telescopic probe itself to slightly rotate at a top surface of the corresponding one of the contacts. After a long time, it will cause scratches and indentations on the top surface of the corresponding one of the contacts. In this way, the structures of the telescopic probe and the test platform are modified in the present disclosure so that the telescopic probe cannot produce rotational friction on the top surface of the corresponding one of the contacts. According to the above idea, the present disclosure provides several embodiments below, so that the telescopic probe cannot rotate in the corresponding probe hole, or at least the rotation range of the telescopic probe is reduced.

Figure 1:
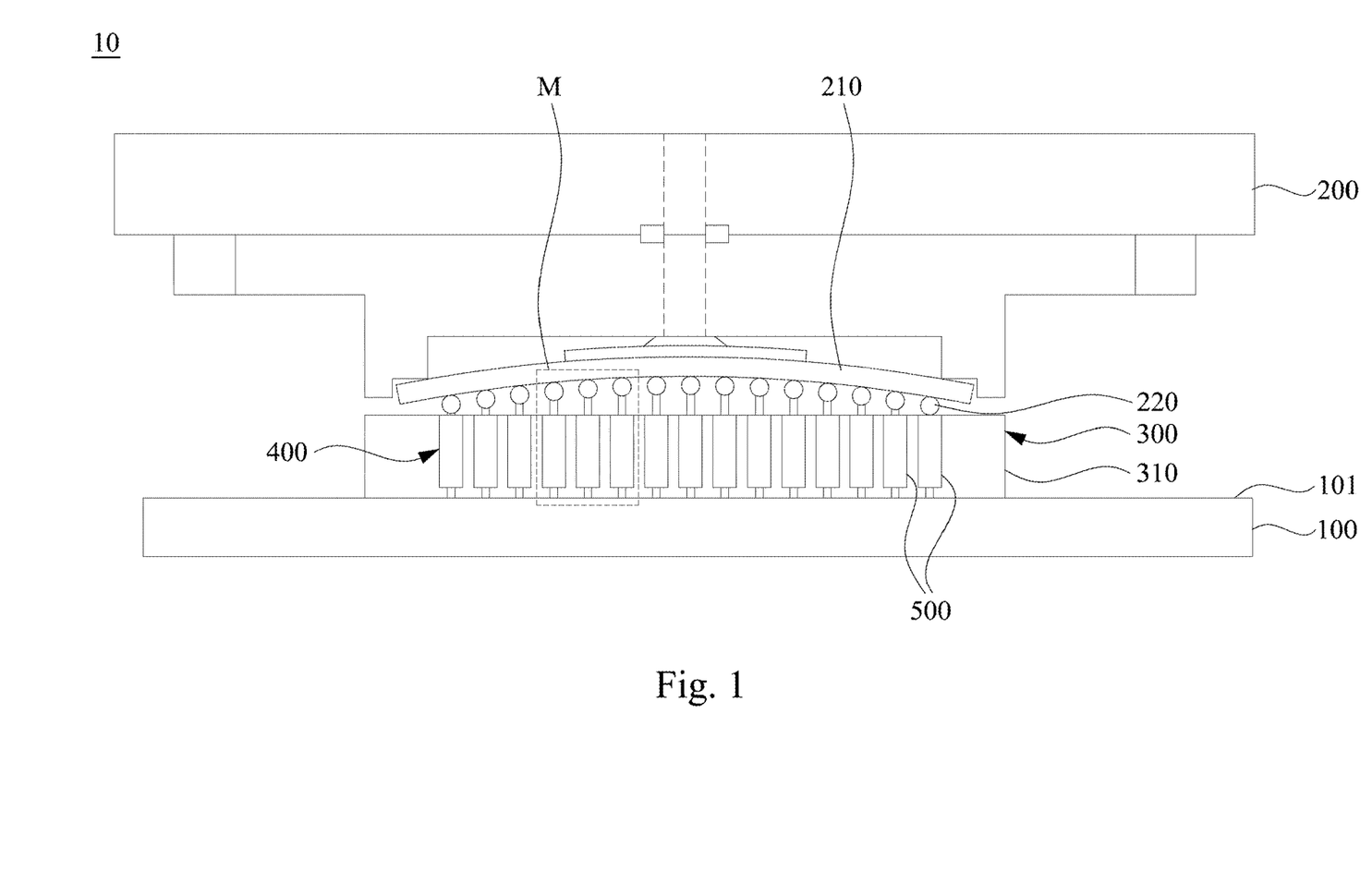
FIG. 1 is a side view of a testing apparatus according to one embodiment of the present disclosure.
Figure 2:
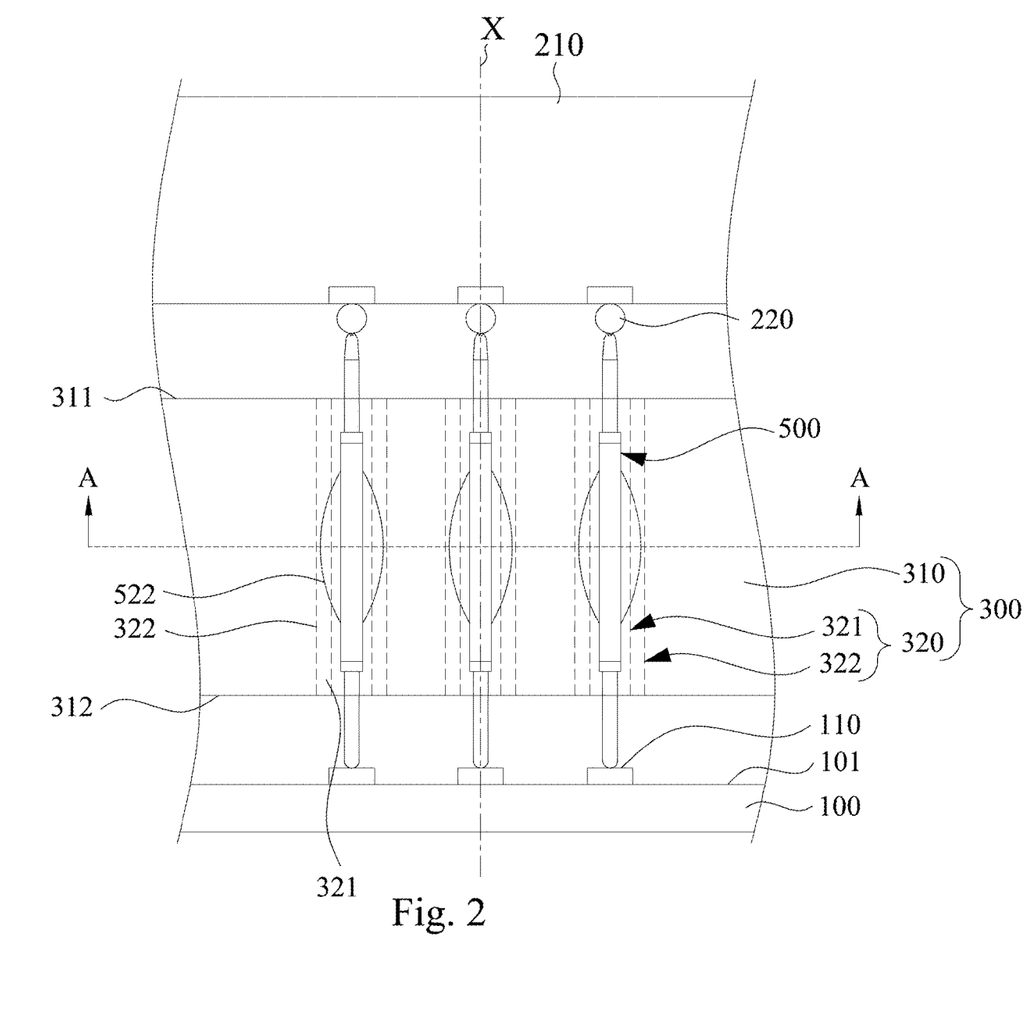
FIG. 2 is a partial enlarged view of an area M viewed in FIG. 1.

Reference is now made to FIG. 1 and FIG. 2, in which FIG. 1 is a side view of a testing apparatus 10 according to one embodiment of the present disclosure, and FIG. 2 is a partial enlarged view of an area M viewed in FIG. 1. As shown in FIG. 1 and FIG. 2, in this embodiment, the testing apparatus 10 includes a circuit board 100, a pickup module 200, a probe station 300 and a probe array 400. The circuit board 100 includes a plurality of contacts 110. The contacts 110 are formed on one surface 101 of the circuit board 100, and arranged in an array. The pickup module 200 is used to press a device under test (called DUT 210 hereinafter, e.g., a semiconductor element) onto the probe station 300. The probe station 300 is located between the pickup module 200 and the circuit board 100, and the probe station 300 includes a platform 310 and a plurality of probe holes 320. The platform 310 is above the circuit board 100, and the probe holes 320 are formed on the platform 310 and arranged in the aforementioned array. More specifically, the platform 310 is formed with a top surface 311 and a bottom surface 312 which are opposite to each other. The top surface 311 of the platform 310 is faced towards the DUT 210, and the bottom surface 312 of the DUT 210 is faced towards the circuit board 100. Each of the probe holes 320 penetrates through the platform 310, and connected to the top surface 311 and the bottom surface 312, respectively. The probe array 400 is located on the probe station 300, and the probe array 400 includes a plurality of telescopic probes 500 (e.g., pogo pins). The telescopic probes 500 are arranged in the aforementioned array and linearly inserted into the probe holes 320, respectively. Two opposite ends of each of the telescopic probes 500 are contacted with one of the contacts 110 of the circuit board 100 and one of the solder balls 220 of the DUT 210, respectively.

Figure 3A:
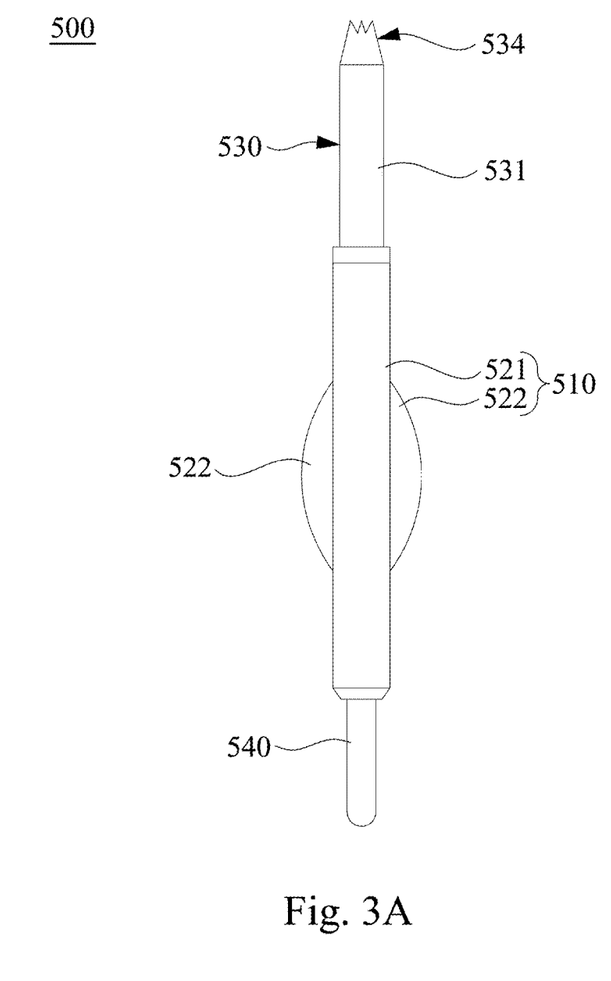
FIG. 3A is a side view of a telescopic probe of FIG. 2.
Figure 3B:
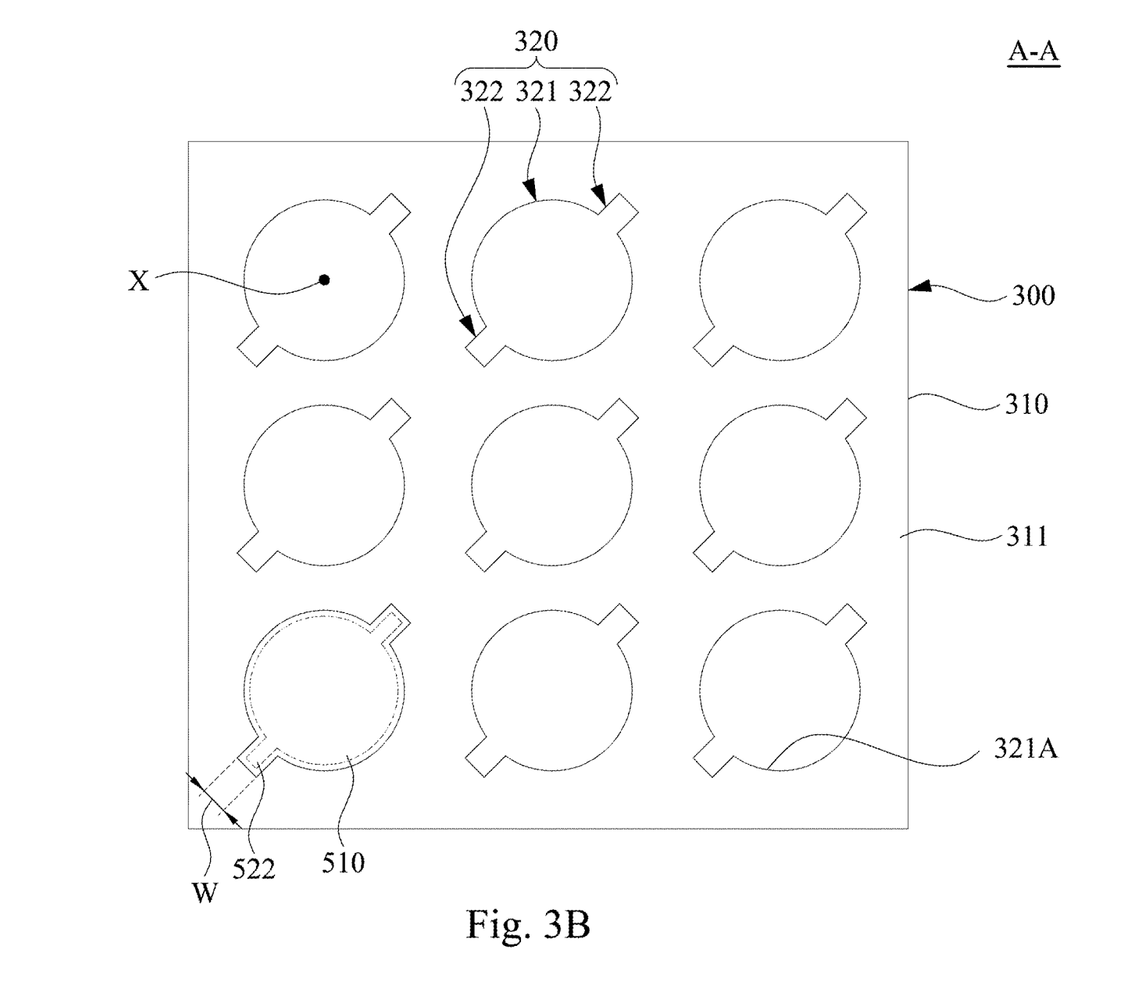
FIG. 3B is a cross-sectional view of the telescopic probe viewed along a line AA of FIG. 2.

FIG. 3A is a side view of a telescopic probe 500 of FIG. 2, and FIG. 3B is a cross-sectional view of the telescopic probe 500 viewed along a line AA of FIG. 2. As shown in FIG. 2 and FIG. 3B, more specifically, each of the probe holes 320 includes a columnar channel 321 and two elongated grooves 322. The columnar channel 321 penetrates through the platform 310 to be connected to the top surface 311 and the bottom surface 312 of the platform 310, respectively (FIG. 2). The elongated grooves 322 are symmetrically recessed on the inner surface 321A of the columnar channel 321 and connected to the columnar channel 321. Each of the elongated grooves 322 penetrates through the platform 310 and is connected to the top surface 311 and the bottom surface 312 of the platform 310 (FIG. 2), and a long axis direction (see a direction X) of the elongated groove 322 is parallel to a long axis direction (see the direction X) of the columnar channel 321. Each of the telescopic probes 500 further includes two fins 522 symmetrically protrude outwards from the outer surface of the telescopic probe 500, and insert into the elongated grooves 322, respectively.

Therefore, when the pickup module 200 presses the telescopic probes 500 down to the contacts 110 of the circuit board 100 through the DUT 210, since the inner surface of each of the elongated grooves 322 blocks the movement of the fins 522 so as to prevent the telescopic probe 500 from rotating. Each of the telescopic probes 500 will not easily generate rotational friction on the top surface 111 of the contact 110 of the circuit board 100, so as to reduce the possibility of scratches and indentations on the contacts of the circuit board 100 by the telescopic probe 500, avoid the reduction of the electrical conductivity of the contacts 110 of the circuit board 100, and maintain the quality of telecommunication transmission and product life.

Figure 4:
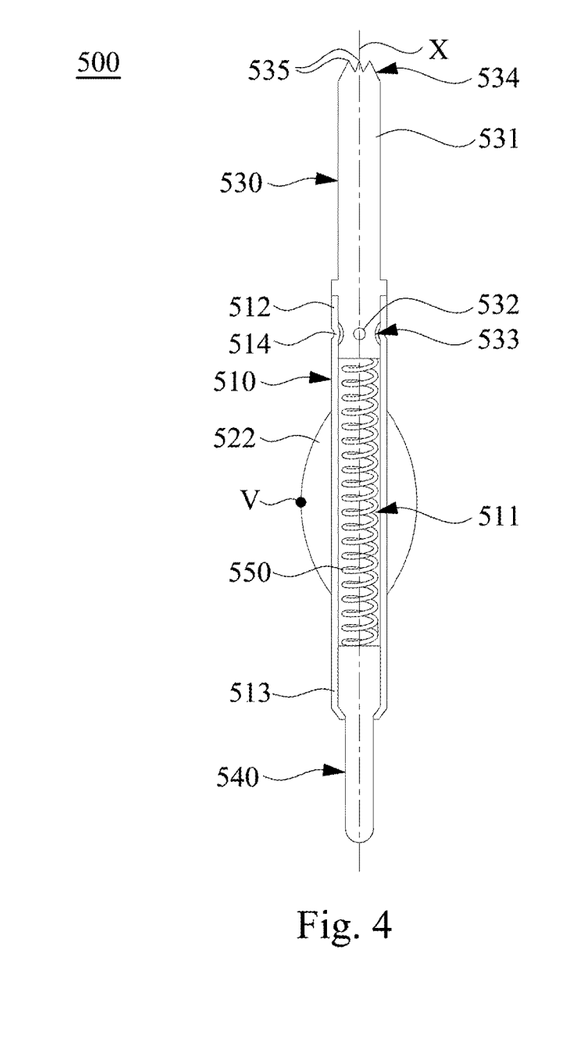
FIG. 4 is a partial see-through view of the telescopic probe of FIG. 3A.

FIG. 4 is a partial see-through view of the telescopic probe 500 of FIG. 3A. As shown in FIG. 2 and FIG. 4, each of the telescopic probes 500 includes a sleeve tube 510, a fixed pin 530, a telescopic pin 540 and a spring 550. The sleeve tube 510 is disposed within one of the probe holes 320, and the sleeve tube 510 is formed with a through channel 511, a first end 512 and a second end 513, and the first end 512 and the second end 513 are opposite to each other. The through channel 511 formed within the sleeve tube 510 is connected to the first end 512 and the second end 513, and a long axis direction (see the direction X) of the sleeve tube 510 is coaxial with a long axis direction (see the direction X) of the through channel 511. The fixed pin 530 includes a pin body 531, a coupling portion 532 and a crown head 534 having plural pin points 535. The coupling portion 532 and the crown head 534 are respectively disposed at two opposite ends of the pin body 531. The coupling portion 532 extends into the through channel 511, and is position-limited to the first end 512 of the sleeve tube 510. The crown head 534 of the fixed pin 530 is used to contact with one of the solder balls 220 (FIG. 2). The telescopic pin 540 is arranged opposite to the fixed pin 530, and the telescopic pin 540 is retractably received within the through channel 511, that is, one part of the telescopic pin 540 is disposed within the through channel 511, and the other part of the telescopic pin 540 extends outwards the sleeve tube 510 from the second end 513 of the sleeve tube 510 so as to contact one of the contacts 110. The spring 550 is disposed within the through channel 511, and respectively connected to the fixed pin 530 and the telescopic pin 540.

In this embodiment, as shown in FIG. 3A and FIG. 3B, the aforementioned sleeve tube 510 includes a tube body 521, and the fins 522 are symmetrically connected to two opposites sides of the tube body 521, and each of the fins 522 extends outwards from the outer surface of the tube body 521 in a protruding direction perpendicular to the direction X. In this embodiment, the cross-section of the tube body 521 is circular, and each of the fins 522 is in a sector shape, a semi-circular shape or an arc shape.

However, the present disclosure is not limited to the cross section shape of the tube body 521 and the fins 522. Therefore, when each of the telescopic probes 500 extends into the corresponding probe hole 320, the tube body 521 of the sleeve tube 510 extends into the columnar channel 321, and the fins 522 on both sides of the tube body 521 are respectively inserted into the corresponding elongated grooves 322.

Thus, when the DUT 210 presses these telescopic probes 500 down to the contacts 110 of the circuit board 100 (FIG. 1), since the fins 522 on both sides of the tube body 521 are respectively restricted within the corresponding elongated grooves 322, each of the telescopic probes 500 is therefore restricted in the corresponding probe hole 320, and unable to rotate around the direction X of the corresponding probe hole 320 (FIG. 2).

It is noted, when each of the telescopic probes 500 is inserted into the corresponding probe hole 320, the side edge (i.e., arc vertex position V) of each of the fins 522 farther away from the tube body 521 touches the inner surface of the elongated groove 322 with a point contact style, so that the telescopic probe 500 can be easily inserted into the probe hole 320. However, the present disclosure is not limited thereto, and in other embodiments, the fins 522 may also be rectangular.

Back to FIG. 4, the sleeve tube 510 further includes at least one convex portion 514 formed on an inner surface of the sleeve tube 510 facing towards the through channel 511 and located within the first end 512 of the sleeve tube 510. The fixed pin 530 further includes a limiting slot 533 recessed around the pin body 531 and located within the first end 512 of the sleeve tube 510. When the pin body 531 of the fixed pin 530 is inserted into the first end 512 of the sleeve tube 510, the convex portion 514 of the sleeve tube 510 extends into the limiting slot 533 of the fixed pin 530, so that the fixed pin 530 is idly rotatable within the sleeve tube 510.

Thus, when the DUT 210 presses these telescopic probes 500 down to the contacts 110 of the circuit board 100 (FIG. 1), although the DUT 210 rotates each of the fixed pins 530, the fixed pin 530 merely can be relatively idly rotated in the sleeve tube 510 so that the sleeve tube 510 and the telescopic pin 540 will not be synchronously driven to rotate. Thus, the possibility of the telescopic probe 500 rotating in the probe hole 320 can be further reduced.

Specifically, as shown FIG. 3B and FIG. 4, since the width W of each of the elongated grooves 322 is similar to the thickness of each of the fins 522, when the sleeve tube 510 of each of the telescopic probes 500 is inserted into the corresponding probe hole 320, and the fins 522 on both sides of the tube body 521 are also respectively inserted into the elongated grooves 322, each of the fins 522 is directly clamped in one of the elongated grooves 322. That is, each of the fins 522 directly contacts the inner surface of the corresponding elongated groove 322, so each of the telescopic probes 500 can be more effectively secured by the elongated grooves 322 so as to avoid from being shaken randomly in the corresponding probe hole 320.

It is noted, although the fins 522 and the elongated grooves 322 mentioned above are two in number in the embodiment, however, the numbers of the fins 522 and the elongated grooves 322 are not limited thereto, in other embodiments, the fin 522 and the elongated groove 322 may only be single, respectively.

Figure 5A:
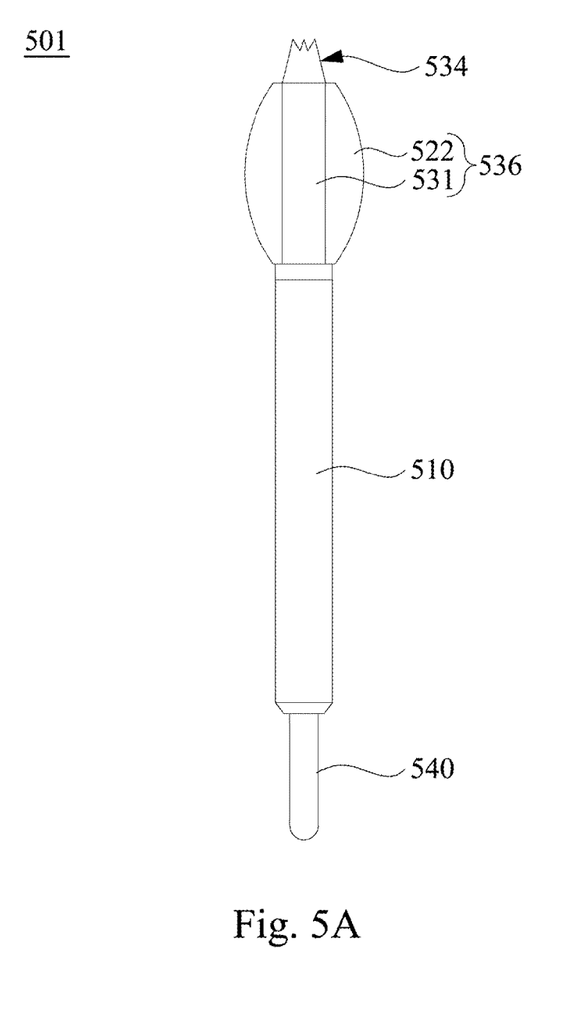
FIG. 5A is a side view of a telescopic probe according to one embodiment of the present disclosure.
Figure 5B:
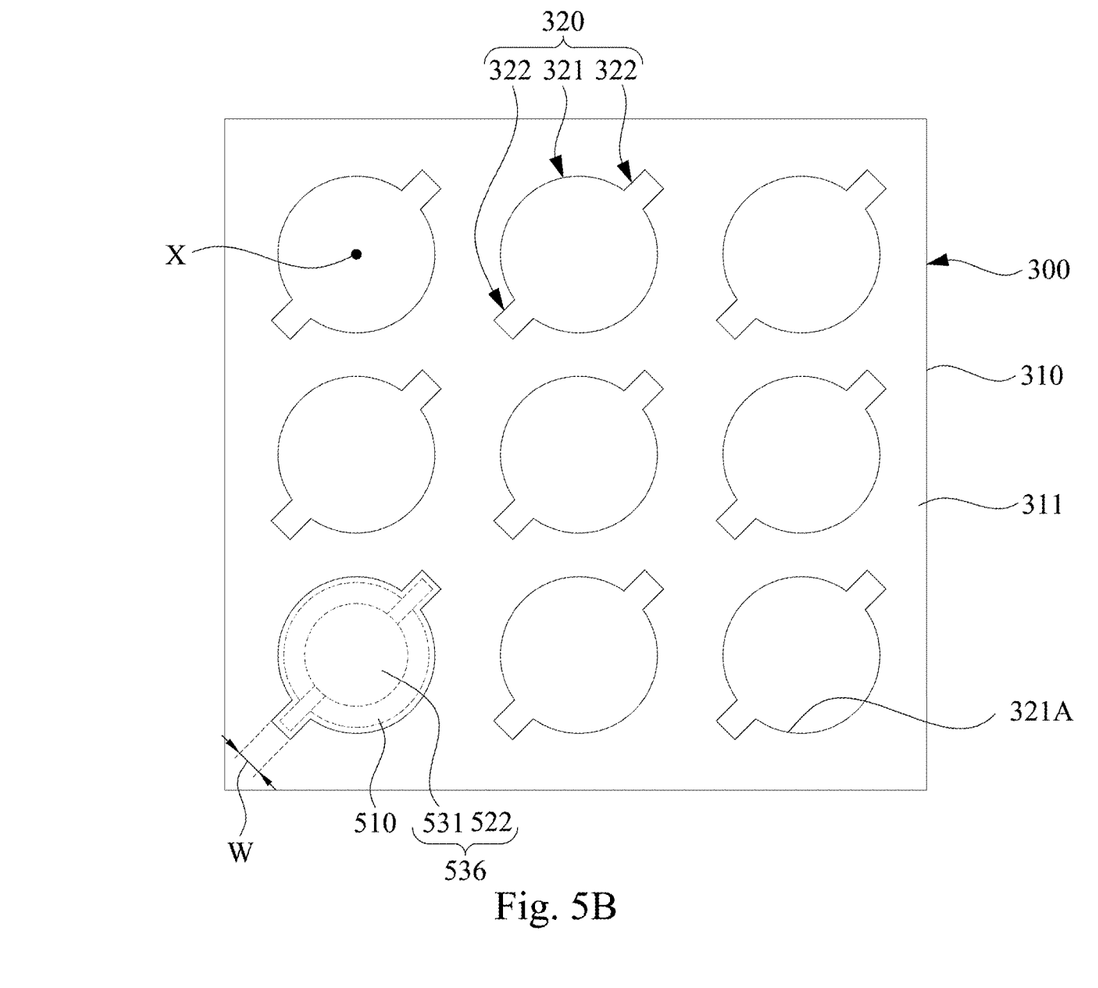
FIG. 5B is a cross-sectional view of a probe station according to one embodiment of the present disclosure, and its cross-sectional location is the same as that in FIG. 3B.

FIG. 5A is a side view of a telescopic probe 501 according to one embodiment of the present disclosure. FIG. 5B is a cross-sectional view of a probe station 301 according to one embodiment of the present disclosure, and its cross-sectional location is the same as that in FIG. 3B. As shown FIG. 5A and FIG. 5B, the testing apparatus of the present embodiment is substantially the same as the above-mentioned testing apparatus, and the difference is that the positions of the fins 522 installed on the telescopic probes 501 in different embodiments are different from each other. Specifically, the fixed pin 536 further includes two fins 522 opposite to each other. The fins 522 are symmetrically connected to two opposite sides of the pin body 531, and each of the fins 522 protrudes outwardly from the outer surface of the pin body 531 in a protruding direction perpendicular to the direction X. Therefore, when each of the telescopic probes 501 is inserted into the corresponding probe hole 320, the sleeve tube 510 and the pin body 531 are inserted into the columnar channel 321 in order, and the fins 522 on both sides of the pin body 531 are respectively inserted into the corresponding elongated grooves 322 therein.

Thus, when the DUT 210 presses these telescopic probes 501 down to the contacts 110 of the circuit board 100 (FIG. 1), since the fins 522 on both sides of the pin body 531 are respectively restricted within the corresponding elongated grooves 322, each of the telescopic probes 501 is therefore restricted in the corresponding probe hole 320, and unable to rotate around the direction X of the corresponding probe hole 320 (FIG. 2).

It is noted, compared with the position of the fin 522 of the telescopic probe 500 of FIG. 3A, as shown in FIG. 5A, the position of the fin 522 of the telescopic probe 501 in this embodiment is closer to the crown head 534 (That is, rotational torque source), the rotational torque exerted to the telescopic probe 501 can be more effectively stopped by the elongated grooves 322 in the corresponding probe hole 320. In addition, in this embodiment, the cross-sectional area of each of the tube body 521 is not limited to a circle or an ellipse shape.

Thus, through the construction of the embodiments above, the disclosure is able to reduce the possibility of scratches and indentations on the contacts of the circuit board by the telescopic probe, thereby avoiding the reduction of the electrical conductivity of the contacts of the circuit board, thereby maintaining the quality of telecommunication transmission and product life.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims and their equivalents.

What is claimed is:

1. A testing apparatus, comprising:
   a circuit board comprising a plurality of contacts;
   a probe station comprising a platform located on the circuit board and used for carrying a device under test (DUT), and a plurality of probe holes formed on the platform and arranged in an array; and
   a probe array comprising a plurality of telescopic probes respectively linearly inserted into the plurality of probe holes, and one end of each of the plurality of telescopic probes contacted with one of the plurality of contacts, and the other end thereof contacted with one of solder balls of the DUT, wherein each of the plurality of probe holes comprises at least one elongated groove penetrating through the platform, and each of the plurality of telescopic probes is provided with at least one fin protruding outwardly therefrom and inserting into the at least one elongated groove.

2. The testing apparatus of claim 1, wherein each of the plurality of telescopic probes comprises: a sleeve tube disposed within one of the plurality of probe holes; a fixed pin, one end of the fixed pin that is position-limited on one end of the sleeve tube, and the other end of the sleeve tube that is provided with a crown head with plural pin points for contacting with the one of solder balls; a telescopic pin arranged opposite to the fixed pin, retractably received within the other end of the sleeve tube, and contacting with one of the plurality of contacts; and a spring disposed within the sleeve tube, and respectively connected to the fixed pin and the telescopic pin.

3. The testing apparatus of claim 2, wherein the at least one fin protrudes outwardly from an outer surface of the sleeve tube in a protruding direction.

4. The testing apparatus of claim 3, wherein each of the plurality of probe holes comprises: a columnar channel penetrating through the platform and connected to two opposite surfaces of the platform, wherein the at least one elongated groove is formed on an inner surface of the columnar channel to be communicated with the at least one elongated groove, and connected to the two opposite surfaces of the platform, and a long axis direction of the at least one elongated groove is parallel to a long axis direction of the columnar channel.

5. The testing apparatus of claim 4, wherein the columnar channel is coaxial with the sleeve tube, and a cross section of the columnar channel and a cross section of the sleeve tube are circular, and the protruding direction is perpendicular to a long axis of the columnar channel.

6. The testing apparatus of claim 4, wherein the at least one fin comprises two fins arranged symmetrically to each other, and the at least one elongated groove comprises two elongated grooves symmetrically formed on the columnar channel.

7. The testing apparatus of claim 2, wherein the at least one fin protrudes outwardly from an outer surface of a fixed pin in a protruding direction.

8. The testing apparatus of claim 7, wherein each of the plurality of probe holes comprises: a columnar channel penetrating through the platform and connected to two opposite surfaces of the platform, wherein the at least one elongated groove is formed on an inner surface of the columnar channel to be communicated with the at least one elongated groove, and connected to the two opposite surfaces of the platform, and a long axis direction of the at least one elongated groove is parallel to a long axis direction of the columnar channel.

9. The testing apparatus of claim 8, wherein the columnar channel is coaxial with the sleeve tube, and a cross section of the columnar channel and a cross section of the sleeve tube are circular, and the protruding direction is perpendicular to a long axis of the columnar channel.

10. The testing apparatus of claim 9, wherein the at least one fin comprises two fins arranged symmetrically to each other, and the at least one elongated groove comprises two elongated grooves symmetrically provided on the columnar channel.

11. The testing apparatus of claim 2, wherein the sleeve tube comprises a through channel and at least one convex portion formed on an inner surface of the sleeve tube facing towards the through channel; and
the fixed pin comprises a pin body and a limiting slot recessed around the pin body and located within one end of the sleeve tube,
wherein the at least one convex portion extends into the limiting slot so that the fixed pin is idly rotatable within the sleeve tube.

12. The testing apparatus of claim 1, wherein the at least one fin is in one of a sector shape, a semi-circular shape and a rectangular shape.

13. The testing apparatus of claim 1, wherein an inner surface of the at least one elongated groove is in direct contact with the at least one fin.

14. A testing apparatus, comprising:
a circuit board comprising a plurality of contacts;
a platform located on the circuit board for carrying a device under test (DUT);
a plurality of probe holes spaced arranged on the platform, each of the plurality of probe holes is connected to two opposite surfaces of the platform, and recessed with at least one elongated groove on an inner surface thereof; and
a plurality of telescopic probes respectively linearly inserted into the plurality of probe holes, and two opposite ends of each of the plurality of telescopic probes contacted with one of the plurality of contacts of the circuit board and one of solder balls of the DUT, respectively,
wherein each of the plurality of telescopic probes comprises at least one arc-shaped fin extending within the at least one elongated groove and contacting with the at least one elongated groove with a point contact style.

15. The testing apparatus of claim 14, wherein each of the plurality of telescopic probes comprises: a sleeve tube disposed within one of the plurality of probe holes; a fixed pin, one end of the fixed pin that is position-limited on one end of the sleeve tube, and the other end of the sleeve tube that is provided with a crown head with plural pin points for contacting with the one of the solder balls; a telescopic pin arranged opposite to the fixed pin, retractably received within the other end of the sleeve tube, and contacting with one of the plurality of contacts; and a spring disposed within the sleeve tube, and respectively connected to the fixed pin and the telescopic pin.

16. The testing apparatus of claim 15, wherein the at least one arc-shaped fin protrudes outwardly from an outer surface of the sleeve tube in a protruding direction.

17. The testing apparatus of claim 15, wherein the at least one arc-shaped fin protrudes outwardly from an outer surface of the fixed pin in a protruding direction.

18. The testing apparatus of claim 15, wherein the at least one arc-shaped fin protrudes outwardly from an outer surface of each of the plurality of telescopic probes in a protruding direction, the one of the plurality of probe holes is coaxial with the sleeve tube, and the protruding direction is perpendicular to a long axis of the sleeve tube.

19. The testing apparatus of claim 15, wherein the at least one arc-shaped fin comprises two fins arranged symmetrically to each other, and the at least one elongated groove comprises two elongated grooves symmetrically formed with each other.

20. The testing apparatus of claim 15, wherein the sleeve tube comprises a through channel and at least one convex portion formed on an inner surface of the sleeve tube facing towards the through channel; and
the fixed pin comprises a pin body and a limiting slot recessed around the pin body and located within one end of the sleeve tube,
wherein the at least one convex portion extends into the limiting slot so that the fixed pin is idly rotatable within the sleeve tube.

* * * * *